United States Patent
Fo et al.

(10) Patent No.: US 6,946,980 B2
(45) Date of Patent: Sep. 20, 2005

(54) INPUT DEVICE

(75) Inventors: Kok Hing Fo, Penang (MY); Yee Loong Chin, Perak (MY); Hoo Chong Wong, Perak (MY)

(73) Assignee: Agilent Technologies, Inc., Palo Alto, CA (US)

( * ) Notice: Subject to any disclaimer, the term of this patent is extended or adjusted under 35 U.S.C. 154(b) by 163 days.

(21) Appl. No.: 10/440,846

(22) Filed: May 19, 2003

(65) Prior Publication Data

US 2003/0193415 A1 Oct. 16, 2003

Related U.S. Application Data

(63) Continuation of application No. 10/128,181, filed on Apr. 23, 2002, now abandoned.

(30) Foreign Application Priority Data

Apr. 24, 2001 (MY) ........................................ PI 20011917

(51) Int. Cl.⁷ ............................................. H03M 11/00
(52) U.S. Cl. .............................. 341/31; 341/22; 341/30; 250/221; 250/229; 250/227.22
(58) Field of Search ............................. 341/20, 22, 31; 250/221, 229, 227.22

(56) References Cited

U.S. PATENT DOCUMENTS

| | | | | | |
|---|---|---|---|---|---|
| 3,886,544 | A | * | 5/1975 | Narodny | 341/31 |
| 4,459,022 | A | * | 7/1984 | Morey | 356/152.2 |
| 4,533,827 | A | * | 8/1985 | Fincher | 250/214 PR |
| 4,607,159 | A | * | 8/1986 | Goodson et al. | 250/221 |
| 4,686,361 | A | * | 8/1987 | Bard | 250/221 |
| 5,117,102 | A | * | 5/1992 | Mitchell | 250/229 |
| 5,421,207 | A | * | 6/1995 | Carroll et al. | 73/856 |

* cited by examiner

Primary Examiner—Albert K. Wong

(57) ABSTRACT

An input device comprising a fixed light source, a plurality of light detectors surrounding the light source, and a member comprising reflective surface portions slidably mounted above the light source. When the member is slid from a neutral position to one of a plurality of activating position, light from the light source is reflected by one of the reflective surface portions directly from the light source to an associated light detector.

14 Claims, 7 Drawing Sheets

INPUT DEVICE

This application is a continuation of Ser. No. 10/128,181 filed Apr. 23, 2002 now abandoned.

This invention relates to an input device for sensing directional information input by a user. In particular, the invention relates to an input device for a portable electronic device such as a mobile telephone.

A typical mobile telephone includes an liquid crystal display (LCD) for displaying information to a user, and a keypad which enables a user to enter information on the LCD display.

European patent publication number 0463856 (Nokia) discloses a mobile telephone with a display and a keypad, and a finger actuated rolling device which enables a user to scan menus on the display.

More recently, mobile telephones have started to include joystick controllers which enable a user to input two-directional information into the telephone. The two-directional information is used, for example, to navigate menus, phone number lists, or on-line data shown on the display. Often, the directional information is also used to control associated functionality in the telephone such as earpiece volume, ringer mode or backlighting.

Joystick controllers used in mobile telephones typically employ electromechanical sensors which tend to be bulky, complex, expensive, and prone to wear. The drive for smaller and cheaper mobile telephones means that a simple and reliable design of a joystick controller is becoming increasingly desirable.

U.S. Pat. No. 5,065,146 (IBM) discloses a joystick controller which uses optical technology. The controller includes a sliding handle supporting an LED. The handle is molded from light transparent material such that light emitted from the LED can propagate to sensors arranged around the handle. Flying leads are used to supply electrical power to the LED. A drawback with this device is that it is still complex in structure and would be relatively bulky and expensive to implement in a mobile telephone.

According to the present invention there is provided an input device comprising: a fixed light source, first and second light detectors responsive to light from the light source, and a member comprising first and second reflective surface portions, the member being slidable between a first position in which the first reflective surface portion reflects light directly from the light source towards the first light detector, and a second position in which the second reflective surface portion reflects light directly from the light source towards the second light detector.

An input device in accordance with the invention has the advantage that it provides an improved design of a joystick controller for an electronic device. By employing a slidable member which reflects light directly from a fixed light source, an input device in accordance with the invention provides a simple and reliable design which does not require special transparent materials in the member, or flying leads to supply power to the light source. The position of the slidable member can be measured by interrogation of the light detectors. In a preferred embodiment the fixed light source is a point source light emitting diode.

Preferably, the input device further comprises third and fourth light detectors and reflective surface portions. Accordingly, the slidable member may be slidable between a third position in which the third reflective surface portion reflects light directly from the light source towards the third light detector, and a fourth position in which the fourth reflective surface portion reflects light directly from the light source towards the fourth light detector. Ideally, the sliding direction between the first and second positions is substantially perpendicular to the sliding direction between the third and fourth positions such that perpendicular directional information input by the user may be detected. Preferably, the two perpendicular directions are configured as a horizontal direction and a vertical direction.

In a preferred embodiment, the member is slidable to a neutral position in-between the first and second slidable positions, and the third and fourth slidable positions. In the neutral position, the reflective surface portions reflect light from the light source substantially away from their respective light detector.

Suitably, the input device includes a housing for slidably mounting the member in a plane above the fixed light source.

Embodiments of the invention will now be described, by way of example, with reference to the accompanying drawings, in which.

Figure 1:
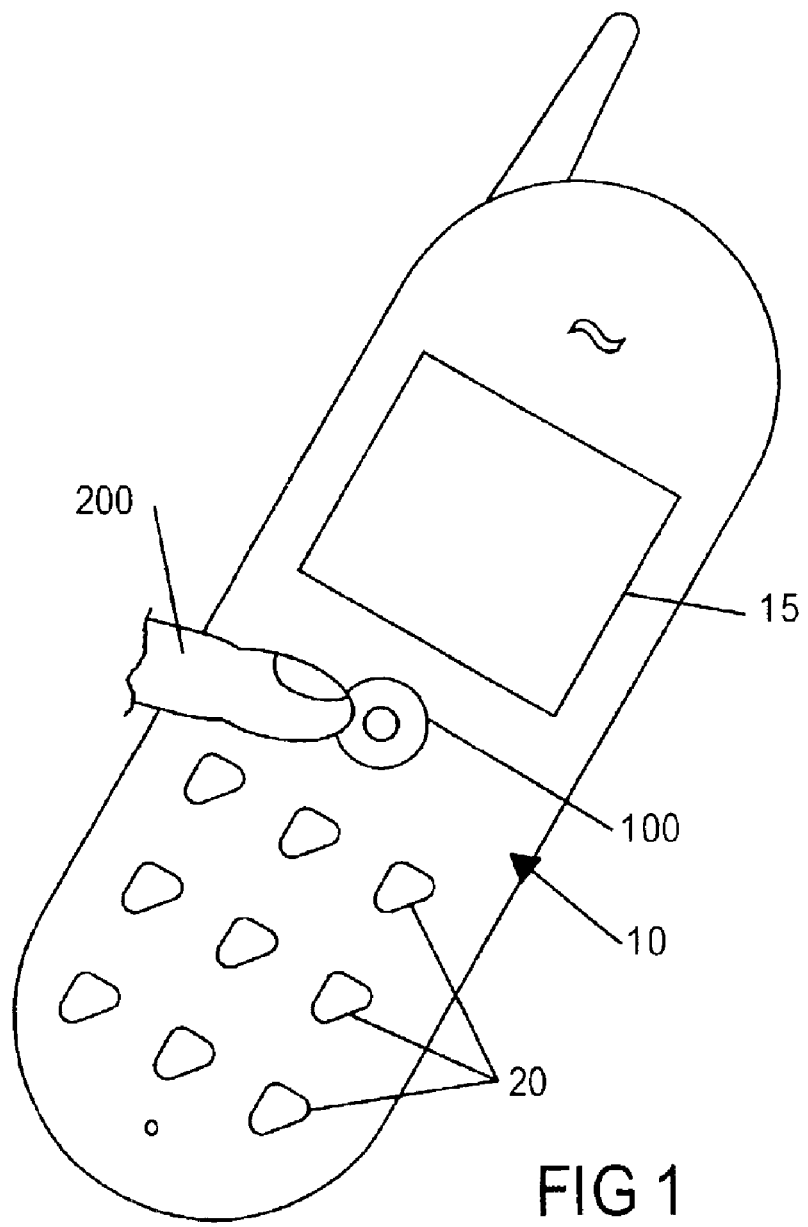
FIG. 1 is a perspective view of a mobile telephone incorporating an input device.

Referring to FIG. 1, there is shown a mobile telephone 10 incorporating a display 15, a keypad containing a set of keys 20, and joystick controller 100. The joystick controller 100 operates as an input device to the mobile telephone 10, sensing directional information input by a thumb or finger of a user 200.

Figure 2A:
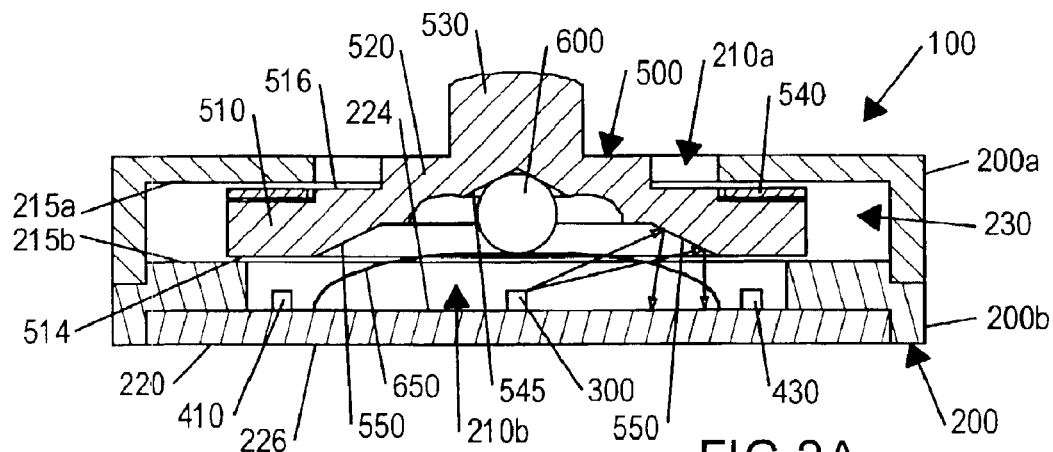
FIG. 2A is a cross-sectional view of the input device of FIG. 1 in accordance with the invention.
Figure 2B:
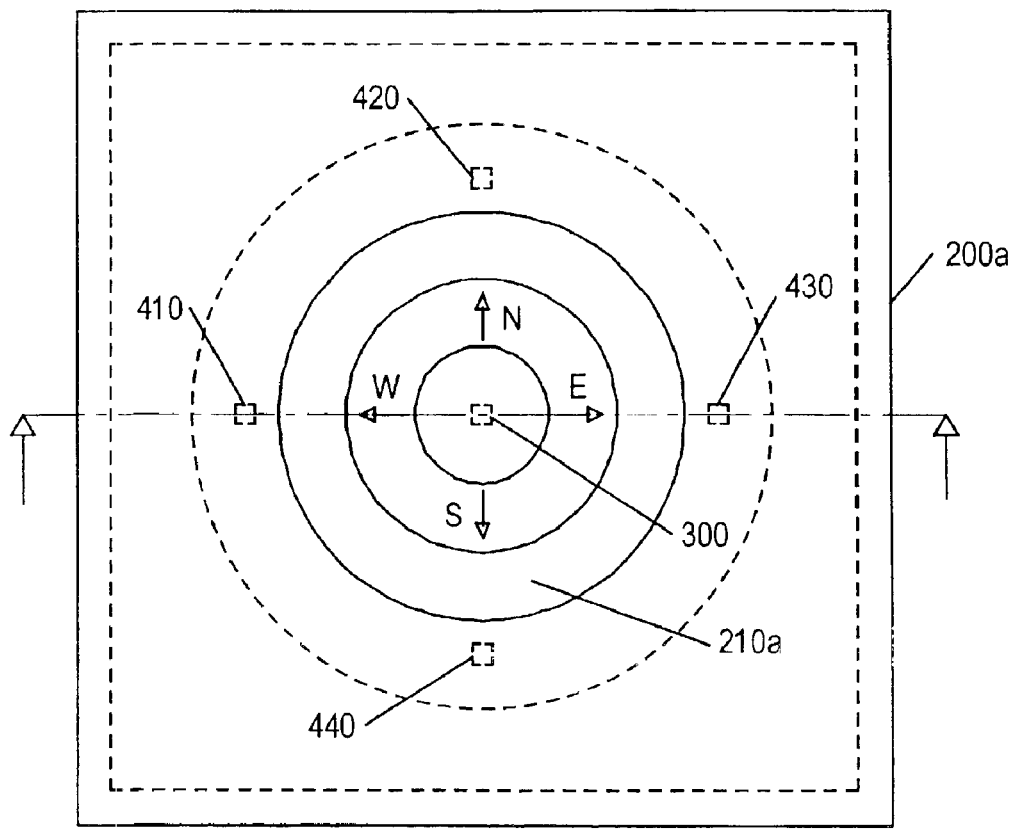
FIG. 2B is a plan view of FIG. 2A.
Figure 3A:
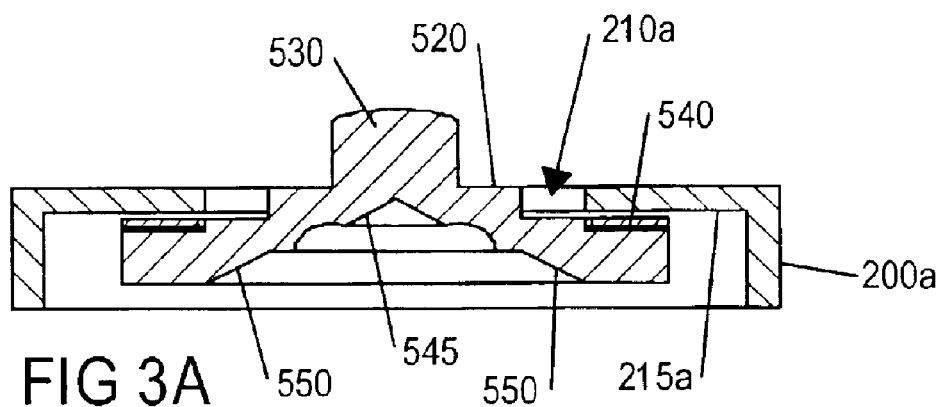
FIG. 3A is a cross-sectional view of an upper part of the input device of FIG. 2A.
Figure 3B:
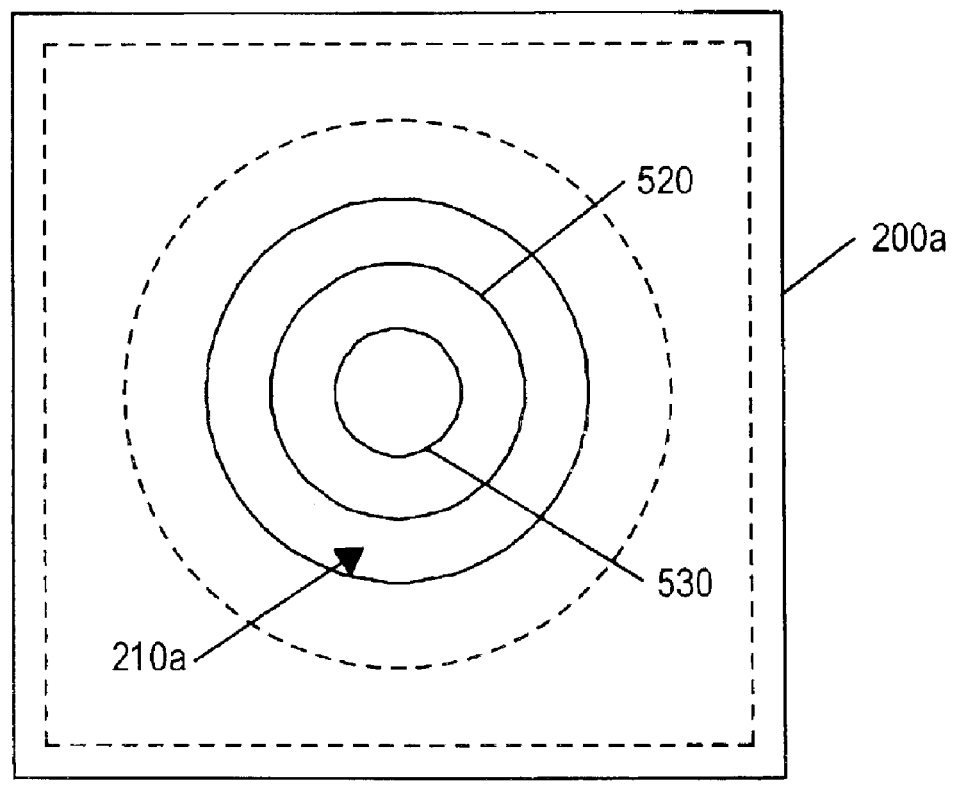
FIG. 3B is a plan view of FIG. 3A.
Figure 4A:
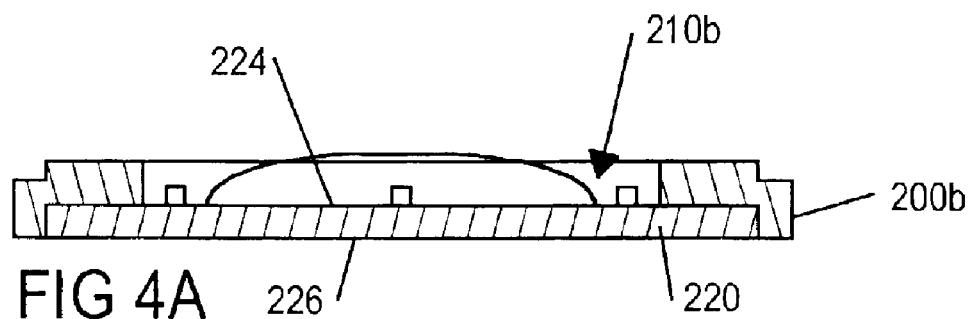
FIG. 4A is a cross-sectional view of an lower part of the input device of FIG. 2A.
Figure 4B:
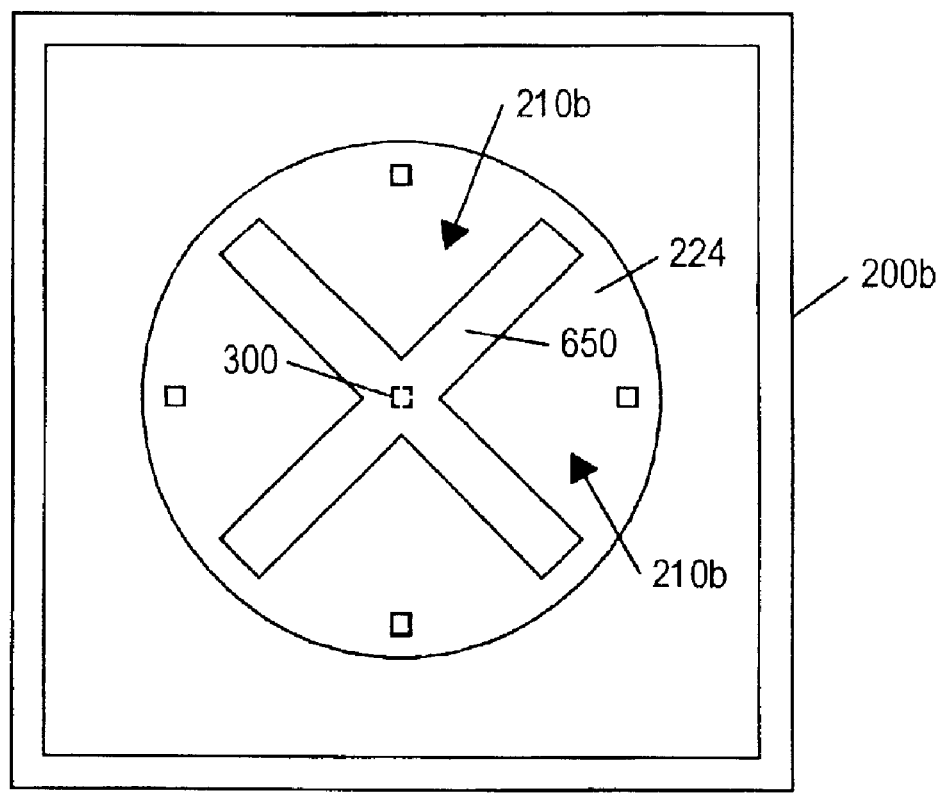
FIG. 4B is a plan view of FIG. 4A.
Figure 5:
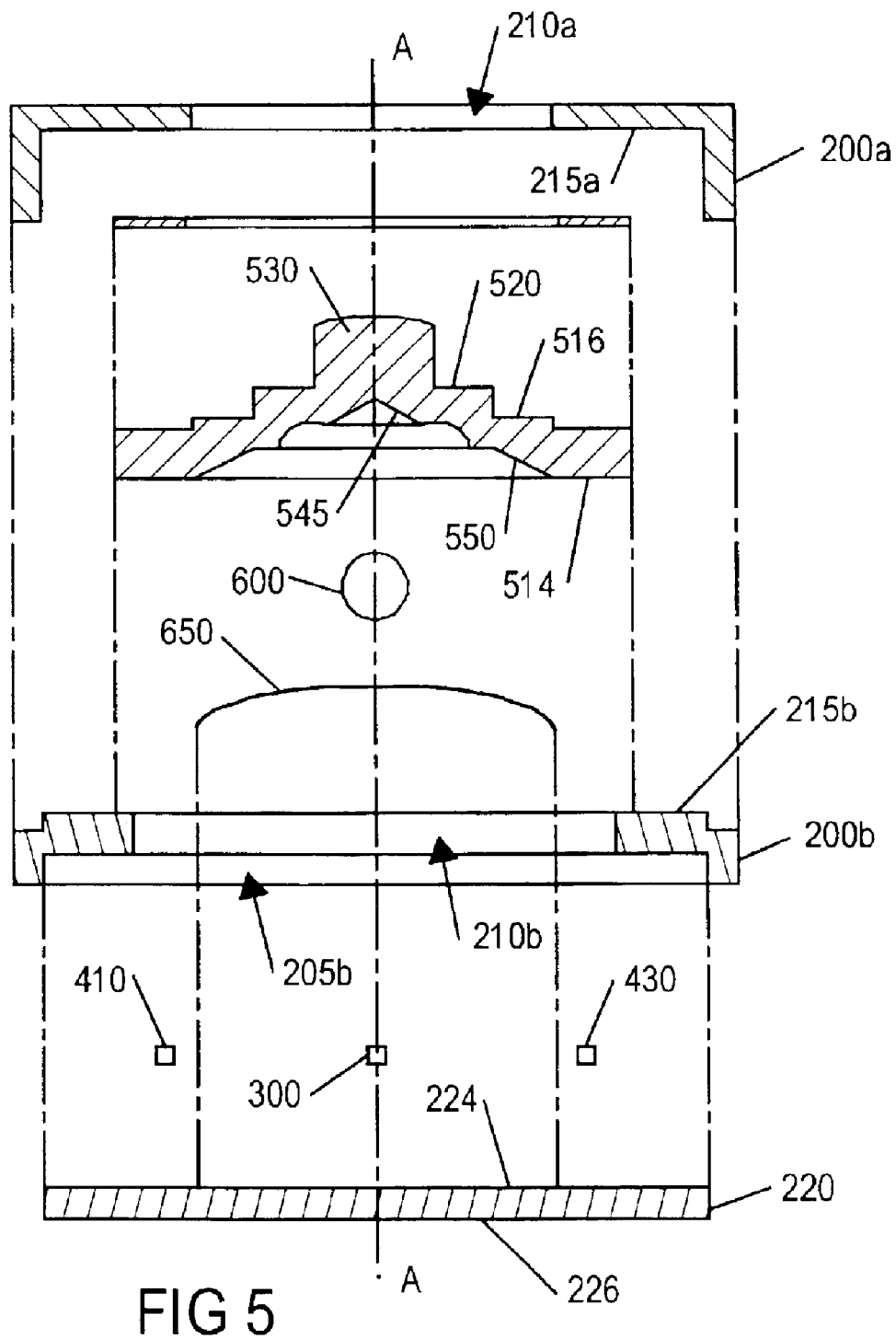
FIG. 5 is an exploded cross-sectional view of the input device of FIG. 2A.

FIGS. 2A and 2B illustrate in more detail the joystick controller 100 of FIG. 1 in an assembled state. FIG. 5 illustrates the same joystick controller 100 in an exploded cross-sectional view, while FIGS. 3A, 3B, 4A and 4C illustrate upper and lower partial assemblies of the joystick controller 100.

The joystick controller 100 comprises a generally rectangular housing 200 made, for example, of a plastics material such as a high temperature liquid crystal polymer (LCP), or a metal such as phosphorous bronze or stainless steel. The housing comprises an upper part 200a and a lower part 200b which are suitably fastened together, for example, by snap fitting, adhesive, ultrasonic welding, or by any other suitable means. The upper and lower parts 200a and 200b both define circular apertures 210a and 210b centered on a central axis of the parts A—A.

The housing 200 further comprises a circuit board substrate 220 which is fastened into a correspondingly shaped recess 205b in the lower part 200b by, for example, snap fitting or adhesive. The circuit board substrate 220 and the recess 205b may, for example, be rectangular-shaped or square-shaped. Regardless of the shape, the upper surface 224 of the substrate 220 is positioned such that it closes a lower end of the aperture 210b in the lower part 200b. In an alternative embodiment, the lower part 200b and the circuit board 220 may be formed as an integral part.

The joystick controller 100 further comprises a light source 300 in the form of a light emitting diode (LED), and four light detectors 410, 420, 430 and 440 implemented as photodiodes. The light source 300 and the four light detectors 410, 420, 430, 440 are surface-mount components which are surface mounted onto the upper surface 224 of the circuit board 220 by reflow soldering. The light source 300 is positioned substantially on the axis A—A of the housing 200 while the light detectors 410, 420, 430, 440 are arranged at 90 degree intervals on a circle centered on the light source 300.

Conductive traces extending from the upper surface 224 to a lower surface 226 of the circuit board 220 couple the surface-mount components to external circuitry in the mobile telephone 10. The external circuitry is needed to power the light source 300 and to amplify the signals from the light detectors 410, 420, 430, 440.

The LED 300 and the photodiodes 410, 420, 430, 440 are chosen such that the wavelength of light emitted by the LED closely matches the peak wavelength sensitivity of the photodiodes. The photodiodes are thus particularly responsive to light emitted from the light source 300. The matched wavelength is preferably in the visible region of the electromagnetic spectrum.

The joystick controller 100 further comprises a reflective member 500 enclosed partially within the housing 200 in such a way that the member may slide relative to the housing and the surface-mount components. Depending on the sliding position of the member relative to the housing 200, the member 500 will operate to reflect light emitted by the light source directly towards or away from the individual light detectors 410, 420, 430, 440.

The slidable member 500 is circularly symmetric and is made from an optically clear plastics material such as polycarbonate. Alternatively, non-clear or light-diffusing materials may be used. The slidable member 500 comprises a disc-shaped body 510, a shoulder portion 520, and a neck-like user-actuable portion 530. The disc-shaped body preferably includes a recess to receive a teflon washer 540.

When the slidable member 500 is assembled together with the housing 200, the disc-shaped body 510 and the washer 540 of the member are contained in a rectangular cavity 230 formed between the upper and lower parts 200a, 200b. The two circular recesses 210a and 210b both have diameters smaller than the diameter of the disc-shaped body 510. The disc-shaped body 510 is thus prevented from entering the recesses and escaping from the cavity 230. An upper planar surface 215b of the lower part 200b surrounding the recess 210b provides a support surface against which a lower planar surface 514 of the disc-shaped body 510 may slide. On the opposite side of the cavity 230, a lower planar surface 215a of the upper part 200a surrounding the recess 210a provides a support surface against the which an upper planar surface 516 of the disc-shaped body 510 and the washer 540 may slide.

Once assembled, the shoulder portion 520 of the slidable member 500 is contained in the recess 210a, and the user-actuable portion 530 extends upwards from the shoulder portion 520 outside the housing 200. The diameter of the recess 210a is greater than the diameter of the shoulder portion 520 enabling the shoulder portion to have a limited freedom of movement within the recess 210a.

The joystick controller 100 further comprises a mechanism for centralising the slidable member, comprising a spherical ball 600 and a spring 650. The spring 650 is made from phosphorous bronze and is shaped like a cross, with the four arms of the cross bent in the same orientation away from the plane of the cross. The ends of the four arms rest on the upper surface 224 of the circuit board 220 such that the cross spring 650 forms a bridge over the light source 300. The center of the cross spring 650 holds the ball 600 on the axis A—A above the light source 300, and urges the ball against a camming surface 545 on the underside of the disc-shaped body 510 of the slidable member 500. The camming surface 545 is conically shaped with the cone apex positioned centrally on the slidable member 500. The forces applied by the spring 650 through the ball 600 against the camming surface urge the slidable member towards a static equilibrium (neutral) position in which the symmetrical axis of the member 500 is aligned with the axis A—A of the housing 200 and the shoulder portion 520 is central in the circular recess 210a.

As mentioned, the slidable member 500 performs the function of reflecting light emitted by the light source 300 directly towards or away from the individual light detectors 410, 420, 430, 440. In order to achieve this function, the slidable member further comprises a generally conical annular surface 550 which tapers from an edge joining the lower planar surface 514 towards the user actuable portion 530 of the member 500. The annular surface 550 generally faces the light source 300 such that light rays emitted by the light source 300 directly illuminate the annular surface 550 (except where obscured by the cross spring 650). The annular surface 550 is treated to make it reflective to light using any suitable method such as, for example, applying a coating of white ink to the surface, polishing the surface, or electroplating the surface with a metal. The reflective annular surface 550 is inclined such that it reflects the incident light rays towards the upper surface 224 of the circuit board 220.

The radius of the annular surface 550 is smaller than the radius of the circle on which the light detectors 410, 420, 430, 440 are positioned. In the neutral position, the annular surface is aligned concentrically within the circle on which the light detectors 410, 420, 430, 440 are positioned such that light reflected by the annular surface from the light source avoids any of the light detectors 410, 420, 430, 440 (see arrows in FIG. 2A).

Figure 7:
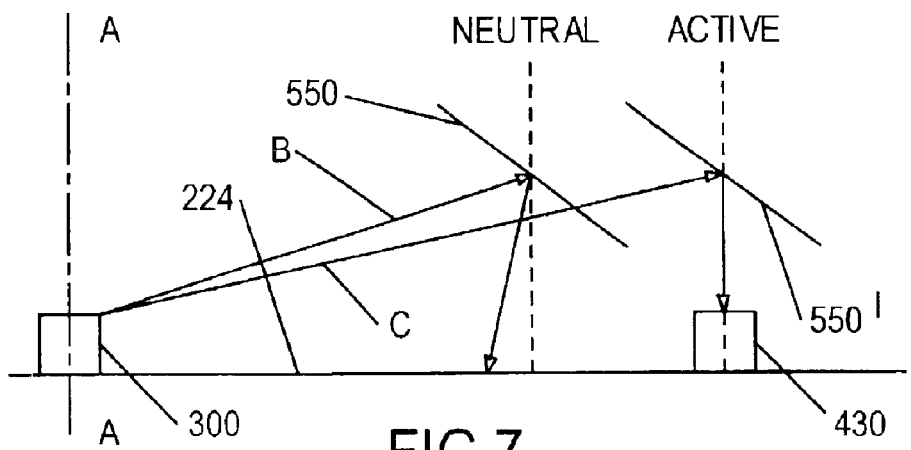
FIG. 7 is schematic view showing a reflective surface of the input device in a NEUTRAL and an ACTIVE position.

Referring to FIG. 7, the inclined annular surface 550 can be seen to reflect light ray B from the light source 300 towards the surface 224, avoiding the light detector 430. The light ray B is actually reflect away from the light detector 430 back towards the axis A—A on which the light detector 300 is positioned. The circular symmetry of the annular surface and the light detectors means that light from the light source is similarly reflected away from the light detectors 410, 420, and 440. Thus, in the neutral position, the light detectors only receive low levels of stray light from the light source 500. Consequently, by suitable calibration of the light detectors or external circuitry, the light detectors can provide a zero-response signal when the slidable member is in the neutral position.

When it is desired to input directional information into the joystick controller 100, the user may urge the user-actuable portion 530 of the slidable member 500 in a chosen direction against the action of the centralising mechanism provided by the ball 600 and spring 650. The sensitivity of the joystick controller 100 to sliding movement of the slidable member in a particular direction depends on the position of the light detectors 410, 420, 430, 440. In the present embodiment, the light detectors are located at up (420), down (440), right (430) and left (410) positions, also known as north, south, east and west positions. Accordingly, the joystick controller 100 is sensitive to movement of the slidable member in those general directions i.e. up, down, right and left. Movement of the slidable member in one of the general directions will activate the light detector corresponding to that direction.

Figure 6A:
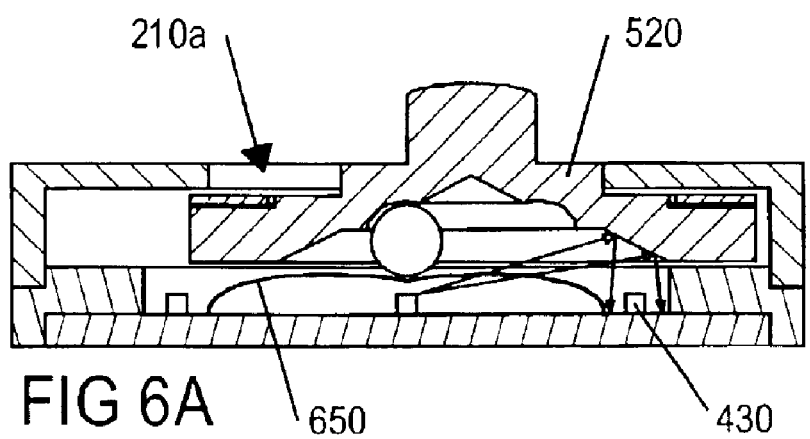
FIG. 6A is similar to FIG. 2A except the input device has been activated to the right.
Figure 6B:
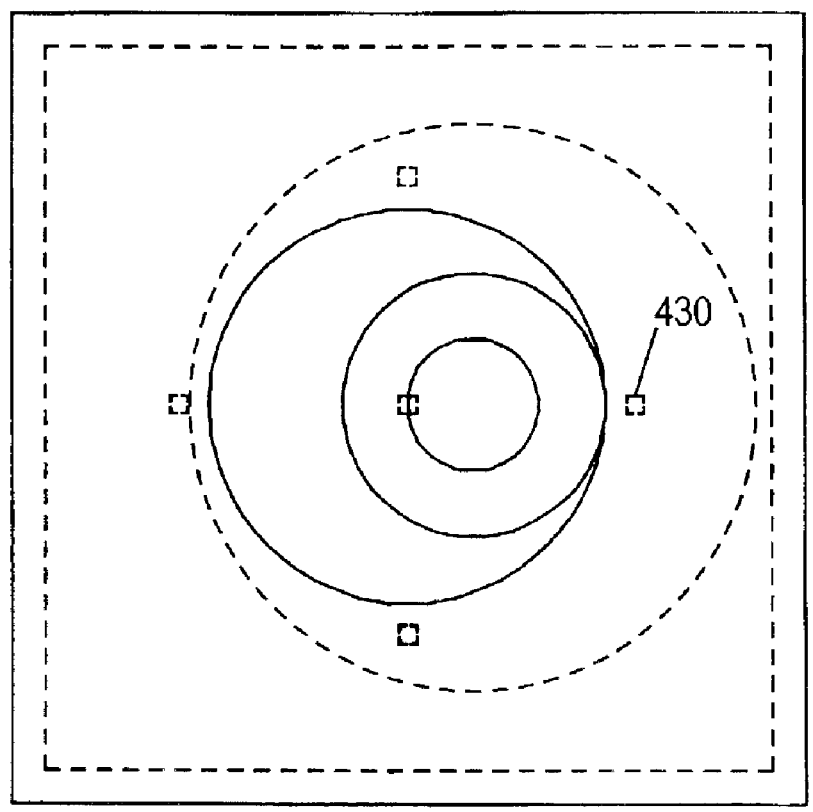
FIG. 6B is a plane view of FIG. 6A.

FIGS. 6A and 6B illustrate the slidable member having been urged to the right by a user so as to active the light detector 430. As shown, the shoulder portion 520 abuts the right-hand the edge of the recess 210a to check the movement of the slidable member 500 at the activating position. In this position, the deformed cross spring 650 stores sufficient potential energy needed to return the slidable member back to the neutral position.

FIG. 7 illustrates schematically the position of the reflective annular surface 550' in the activate position. In this active position, a portion of the inclined annular surface 550' located above the light detector can be seen to reflect light ray C from the light source 300 towards the light detector 430. The portion of the inclined annular surface which reflects light towards the light detector 430 will be up to approximately 5 degrees wide but may vary according to the size of the light detector. Compared to the light ray B, the light ray C is incident on the annular surface portion 550' at a larger angle of incidence. Accordingly, the light ray C is reflected with a larger angle of reflection. The direction of the reflected light ray C is substantially parallel with the axis A—A which optimises transmission of light ray through a top sensing window of the light detector 430.

With the slidable sensor in the active position, the light detector 430 will receive a relatively high intensity of light from the light source 500. The high intensity of light will active the light detector 430. Interrogation of the light detector 430 by external circuitry will then provide an indication of the sliding position of the member 500 and hence the directional information input by the user.

Activation of the light detector 430 by sliding the slidable member 500 to the right has been demonstrated. In the same way, the other light detectors 410, 420, and 440 would be activated by sliding the slidable member 500 generally to the left (410), upwards (420), and downwards (440) respectively. In each case, a different portion of the reflective annular surface would reflect light from the light source 300 towards the respective light detector. Consequently, each light detector has a corresponding portion of the annular surface for receiving and reflecting light when the slidable member is in the active position.

During activation of one light detector by an associated annular surface portion, the remaining portion of the annular surface does not move to a position sufficient to activate the other light detectors.

Figure 8:
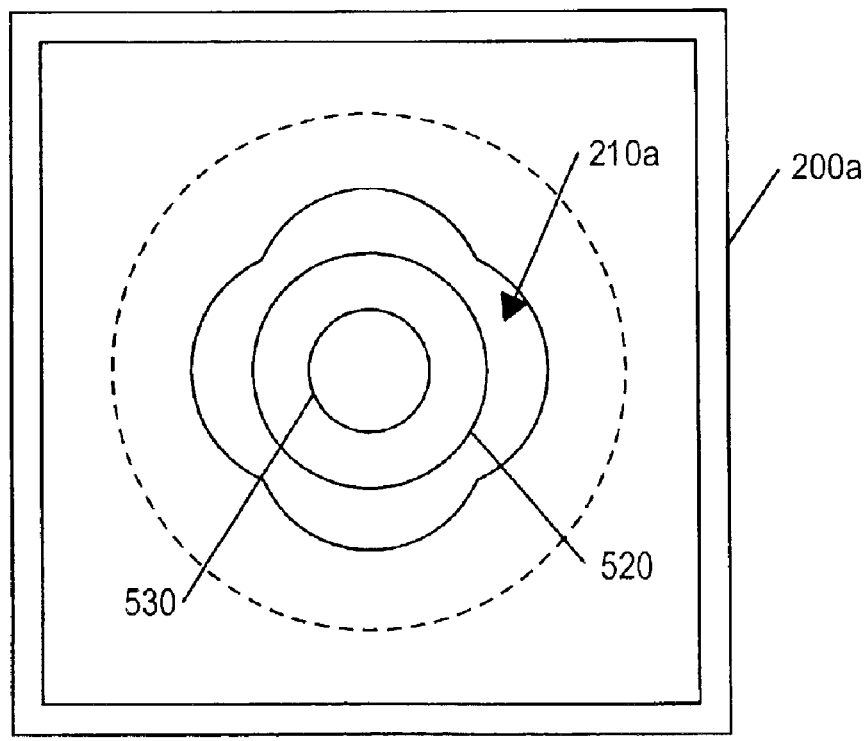
FIG. 8 is a plan view of an alternative embodiment of the input device of FIG. 2A.

FIG. 8 shows an alternative embodiment of the joystick controller 100 in which the recess 210a is shaped to include four lobes. Each lobe corresponds to a light detector of the controller and guides the user in the general direction to activate that light detector.

A notable advantage associated with the joystick controller 100 is the ability of the transparent slidable member 500 to transmit light from the light source 300 out through the user-actuable portion 530. This gives the user-actuable portion 530 a pleasant appearance, and helps the user to locate the user-actuable portion 530 in low-light conditions.

It will be evident in view of the foregoing description that various modifications may be made within the scope of the present invention. For example there may be more or less than four light detectors, and the joystick controller may be incorporated into a PDA or any other electronic device instead of a mobile telephone.

Furthermore, the circuit board substrate or part of the housing of the joystick controller may be provided by a circuit board or housing of the electronic device in which it is incorporated. In this way, the input device would be assembled together with assembly of the electronic device.

What is claimed is:

1. An input device comprising:
   a fixed light source,
   first and second light detectors responsive to light from the light source,
   a member comprising first and second reflective surface portions, the member being slidable between a first position in which the first reflective surface portion reflects light directly from the light source towards the first light detector, and a second position in which the second reflective surface portion reflects light directly from the light source towards the second light detector, and
   third and fourth light detectors responsive to light from the light source, and the member further comprising third and fourth reflective surface portions, the member being slidable between a third position in which the third reflective surface portion reflects light directly from the light source towards the third light detector, and a fourth position in which the fourth reflective surface portion reflects light directly from the light source towards the fourth light detector.

2. An input device as claimed in claim 1, wherein the position of the member may be measured by interrogation of the detectors.

3. An input device as claimed in claim 1, wherein the fixed light source is a light emitting diode.

4. An input device as claimed in claim 1, wherein the fixed light source is a point source.

5. An input device as claimed in claim 1, wherein the second reflective surface portion reflects light from the light source substantially away from the second light detector in the first position, and the first reflective surface portion reflects light from the light source substantially away from the second light detector in the second position.

6. An input device as claimed in claim 1, wherein the member is slidable to a neutral position in-between the first and second positions, in which the first and second reflective surface portions reflect light from the light source substantially away from the first and second light detector respectively.

7. An input device as claimed in claim 1, wherein the sliding direction between the first and second positions is substantially perpendicular to the sliding direction between the third and fourth positions.

8. An input device as claimed in claim 1, wherein the member is slidably mounted in a plane above the fixed light source.

9. An input device as claimed in claim 8, wherein the reflective surface portions reflect light towards the light detectors in a direction substantially perpendicular to the plane.

10. An input device as claimed in claim 1, wherein the reflecting surface portions are portions of a continuous annular surface.

11. An input device as claimed in claim 10, wherein the annular surface is a conical surface tapering away from the fixed light source.

12. An input device as claimed in claim 1, wherein the reflective surface portions are on an external surface of the member.

13. An input device as claimed in claim 1, wherein the fixed light source and the light detectors are mounted on a substrate.

14. An input device as claimed in claim 13, wherein the substrate forms part of a housing of the input device, the housing enclosing the fixed light source and the member being slidably mounted in the housing.

* * * * *